United States Patent
Tsai et al.

(10) Patent No.: US 10,593,611 B2
(45) Date of Patent: Mar. 17, 2020

(54) LIQUID COOLING SYSTEM (71) Applicant: COOLER MASTER CO., LTD., New Taipei (TW)

(72) Inventors: Shui-Fa Tsai, New Taipei (TW); Hsin-Hung Chen, New Taipei (TW)

(73) Assignee: Cooler Master Co., Ltd., New Taipei (TW)

( * ) Notice: Subject to any disclaimer, the term of this patent is extended or adjusted under 35 U.S.C. 154(b) by 299 days.

(21) Appl. No.: 15/460,242

(22) Filed: Mar. 16, 2017

(65) Prior Publication Data
US 2018/0184547 A1 Jun. 28, 2018

(30) Foreign Application Priority Data

Dec. 28, 2016 (CN) .................... 2016 2 1456926 U (51) Int. Cl.
*H01L 23/473* (2006.01)
*F28F 9/26* (2006.01)
*H01L 23/467* (2006.01)
*F28D 15/00* (2006.01)
*F28D 21/00* (2006.01)

(52) U.S. Cl.
CPC ............ *H01L 23/473* (2013.01); *F28D 15/00* (2013.01); *F28F 9/262* (2013.01); *H01L 23/467* (2013.01); *F28D 2021/0029* (2013.01); *F28D 2021/0031* (2013.01); *F28F 2250/08* (2013.01)

(58) Field of Classification Search
CPC ...... H01L 23/473; H01L 23/467; F28F 9/262; F28F 9/266; F28D 2021/0029; F28D 2021/0031; F28D 15/00
See application file for complete search history.

(56) References Cited

U.S. PATENT DOCUMENTS

| 6,273,182 | B1 * | 8/2001 | Pautler | F28D 1/0435 165/140 |
| 10,136,552 | B2 * | 11/2018 | Liu | G06F 1/20 |
| 2005/0168939 | A1 * | 8/2005 | Iijima | F28D 1/05375 361/679.47 |
| 2008/0179044 | A1 * | 7/2008 | Hu | H01L 23/473 165/80.4 |
| 2016/0209010 | A1 * | 7/2016 | Wu | F21V 21/28 |

* cited by examiner

Primary Examiner — Jon T. Schermerhorn, Jr.
(74) Attorney, Agent, or Firm — Alan D. Kamrath; Karin L. Williams; Mayer & Williams PC (57) ABSTRACT A liquid cooling system includes a liquid cooling head, a support frame, two positioning members and a radiator. The support frame is disposed on the liquid cooling head. The support frame has two side plates opposite to each other. Each of the positioning members is disposed on one of the two side plates. Each of the positioning members has at least two positioning recesses. The radiator is disposed between and pivotally connected to the two side plates. Opposite sides of the radiator have a positioning protrusion. The positioning protrusion is engaged with one of the at least two positioning recesses, such that the radiator is capable of rotating with respect to the liquid cooling head between at least two different positions.

10 Claims, 14 Drawing Sheets

LIQUID COOLING SYSTEM

BACKGROUND OF THE INVENTION

1. Field of the Invention

The invention relates to a liquid cooling system and, more particularly, to a liquid cooling system allowing a radiator to rotate with respect to a liquid cooling head between at least two different positions.

2. Description of the Prior Art

Heat dissipating device is a significant component for electronic devices. When an electronic device is operating, the current in circuit will generate unnecessary heat due to impedance. If the heat is accumulated in the electronic components of the electronic device without dissipating immediately, the electronic components may get damage due to the accumulated heat. Therefore, the performance of heat dissipating device is a significant issue for the electronic device.

So far the heat dissipating device used in the electronic device usually consists of a heat pipe, a heat dissipating fin and a fan, wherein an end of the heat pipe contacts the electronic component, which generates heat during operation, another end of the heat pipe is connected to the heat dissipating fin, and the fan blows air to the heat dissipating fin, so as to dissipate heat. However, the fan may generate noise and consume high power under high speed and the aforesaid problems are difficult to be solved by the manufacturer. Accordingly, a liquid cooling system is developed.

In general, a liquid cooling system essentially consists of a liquid cooling head, a radiator and a pump. When the liquid cooling system is dissipating heat from an electronic component, the pump transports a cooling liquid to the liquid cooling head, the cooling liquid absorbs the heat generated by the electronic component, and then the radiator cools the cooling liquid. In the liquid cooling system, the related positions between the liquid cooling head, the radiator and the pump are fixed and cannot be adjusted. Furthermore, since the arrangements of the electronic components in different electronic devices are different from each other, the space used for installing the liquid cooling system in the electronic device is limited. Accordingly, the liquid cooling system has to be customized for different electronic devices, such that the liquid cooling system is not flexible in use and the manufacturing cost may increase.

SUMMARY OF THE INVENTION

The invention provides a liquid cooling system allowing a radiator to rotate with respect to a liquid cooling head between at least two different positions, so as to solve the aforesaid problems.

According to an embodiment of the invention, a liquid cooling system comprises a liquid cooling head, a support frame, two positioning members, a radiator, two pivot shafts, and two fixing members. The support frame is disposed on the liquid cooling head. The support frame has two side plates opposite to each other. Each of the positioning members is disposed on one of the two side plates. Each of the positioning members has at least two positioning recesses and a fixing portion. The radiator is disposed between and pivotally connected to the two side plates. Opposite sides of the radiator have a pivot protrusion and a positioning protrusion. The positioning protrusion engaged with one of the at least two positioning recesses, such that the radiator is capable of rotating with respect to the liquid cooling head between at least two different positions. The pivot shaft passes through the side plate and is pivotally connected to the pivot protrusion of the radiator. The fixing member passes through the side plate and is fixed to the fixing portion of the positioning member, such that the positioning member is fixed on the side plate.

IN DETAILED DESCRIPTION

As mentioned in the above, since the radiator can rotate with respect to the liquid cooling head between at least two different positions, a user or a manufacturer can adjust the position of the radiator with respect to the liquid cooling head according to the arrangement of electronic components in an electronic device, so as to prevent the liquid cooling system from interfering with the electronic components in the electronic device. Accordingly, the liquid cooling system of the invention can be applied to various electronic devices.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
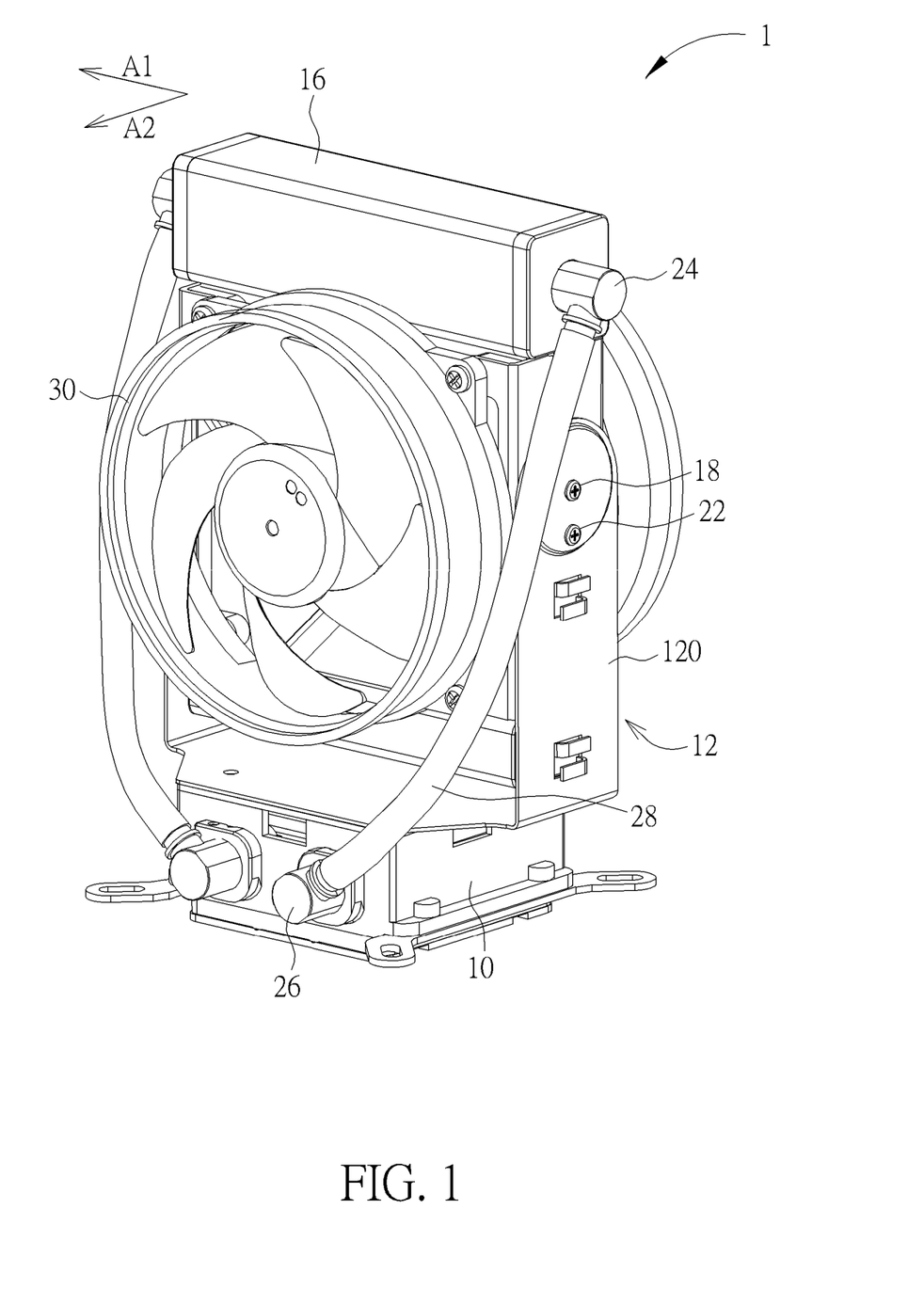
FIG. 1 is a schematic view illustrating a liquid cooling system according to an embodiment of the invention.
Figure 2:
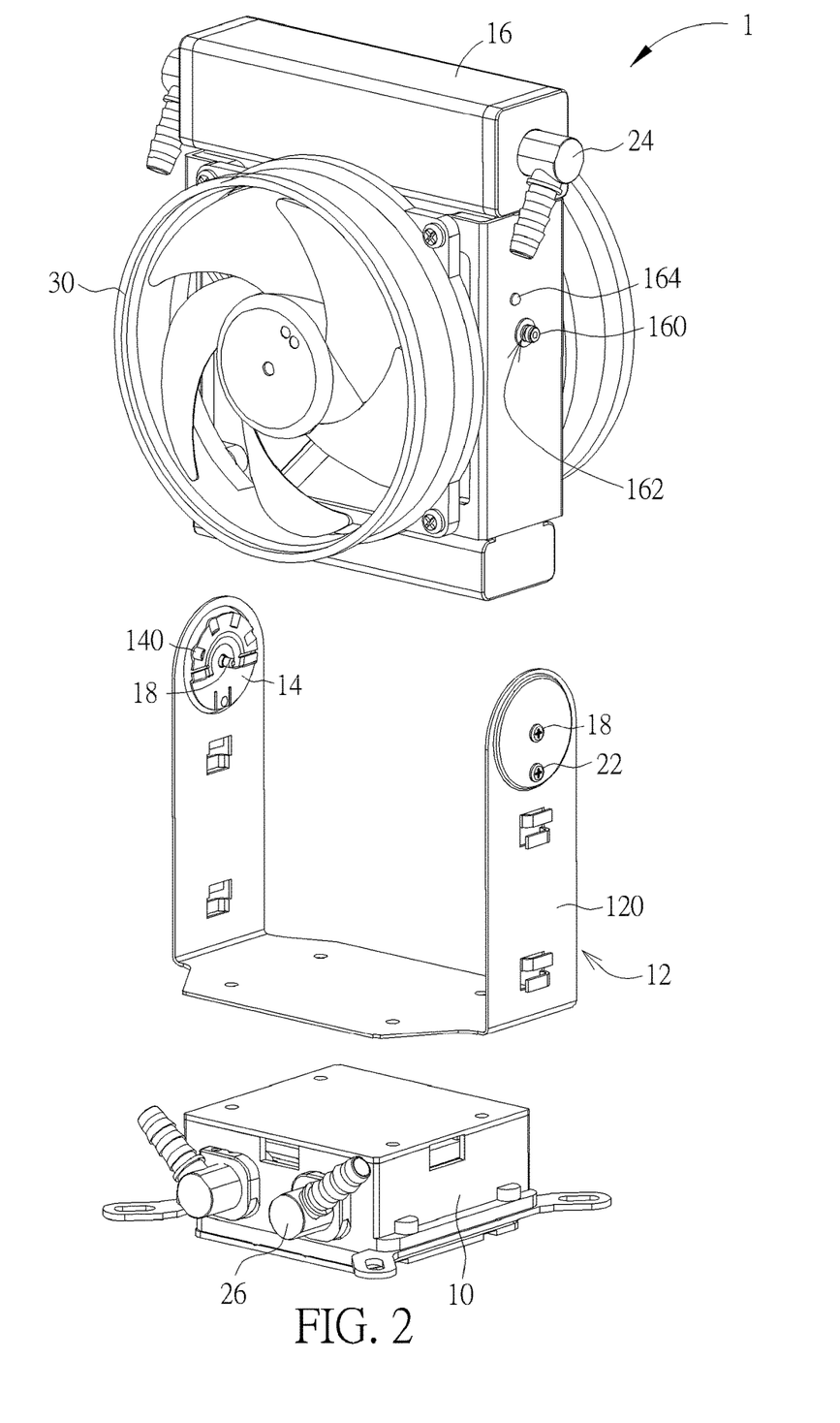
FIG. 2 is an exploded view illustrating the liquid cooling system shown in FIG. 1.
Figure 3:
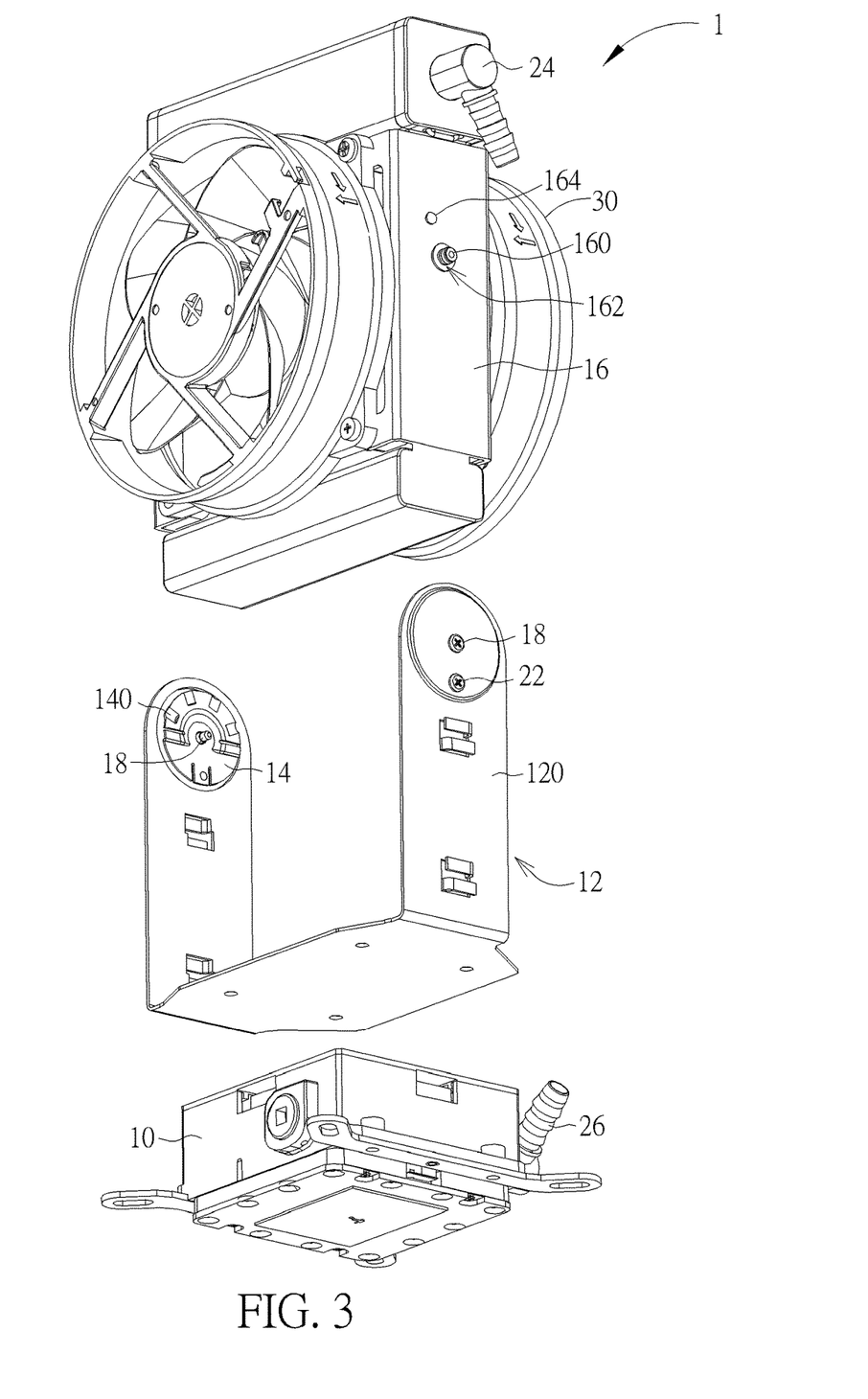
FIG. 3 is an exploded view illustrating the liquid cooling system shown in FIG. 1 from another viewing angle.
Figure 4:
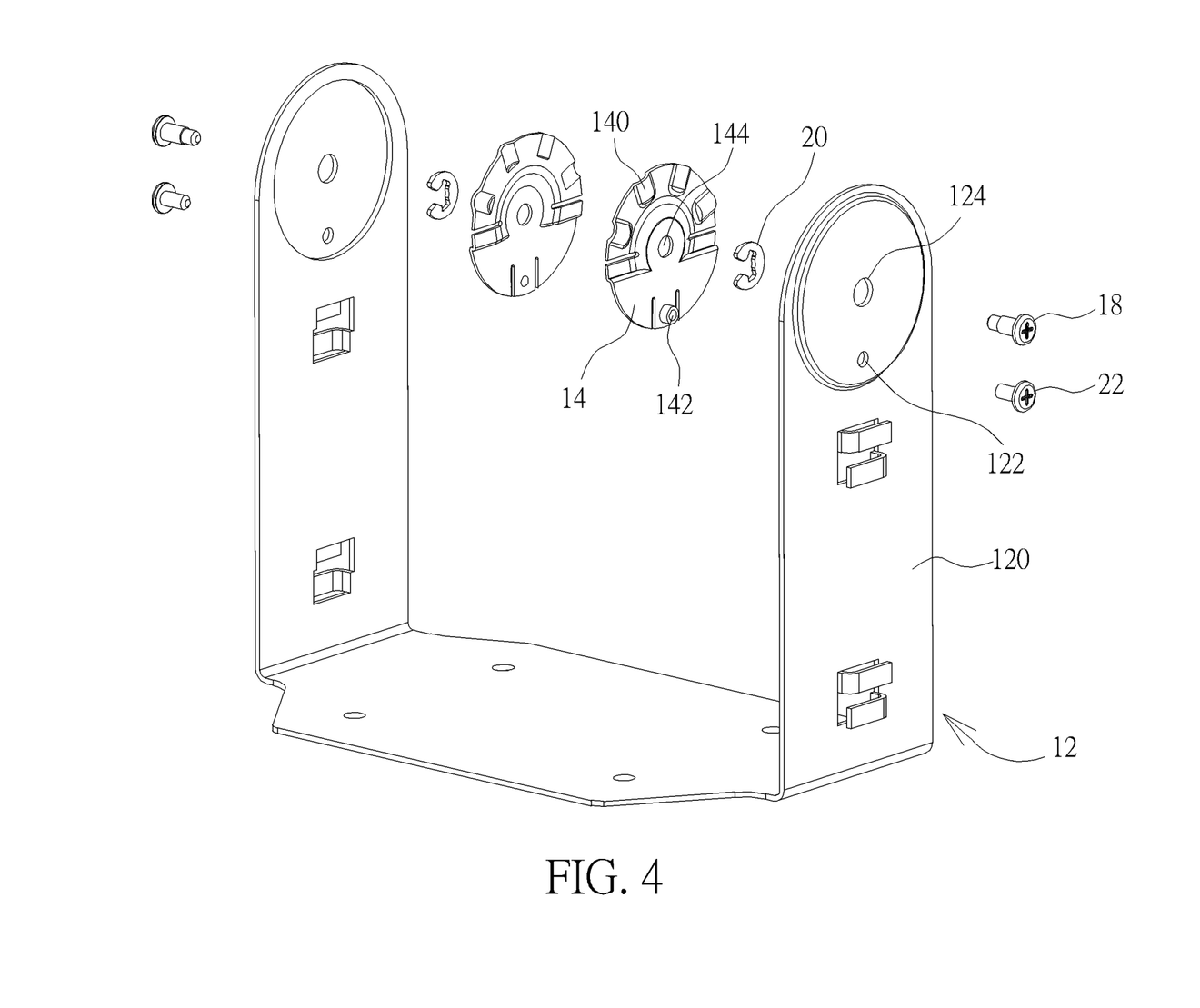
FIG. 4 is an exploded view illustrating the support frame and the positioning member shown in FIG. 2.
Figure 5:
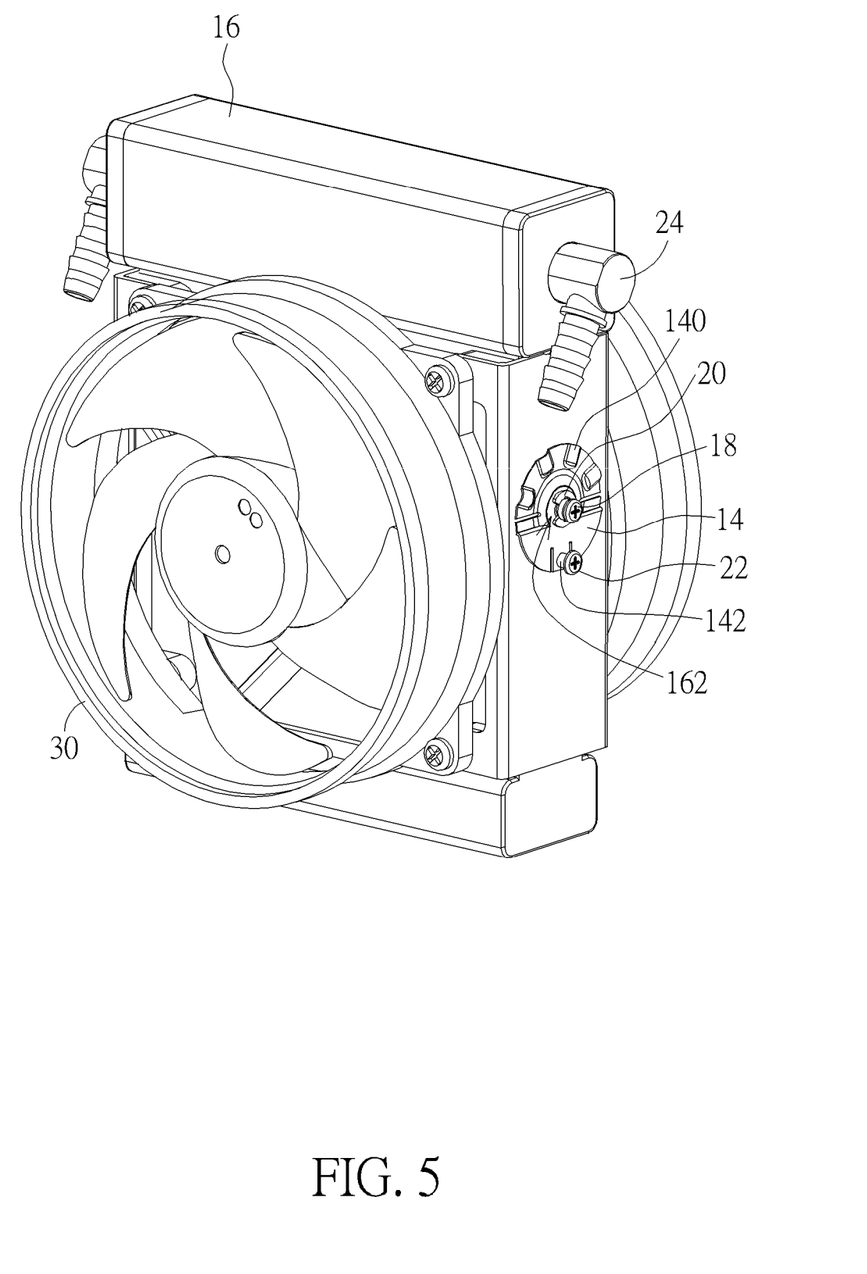
FIG. 5 is a perspective view illustrating the support frame shown in FIG. 1 after being removed.
Figure 6:
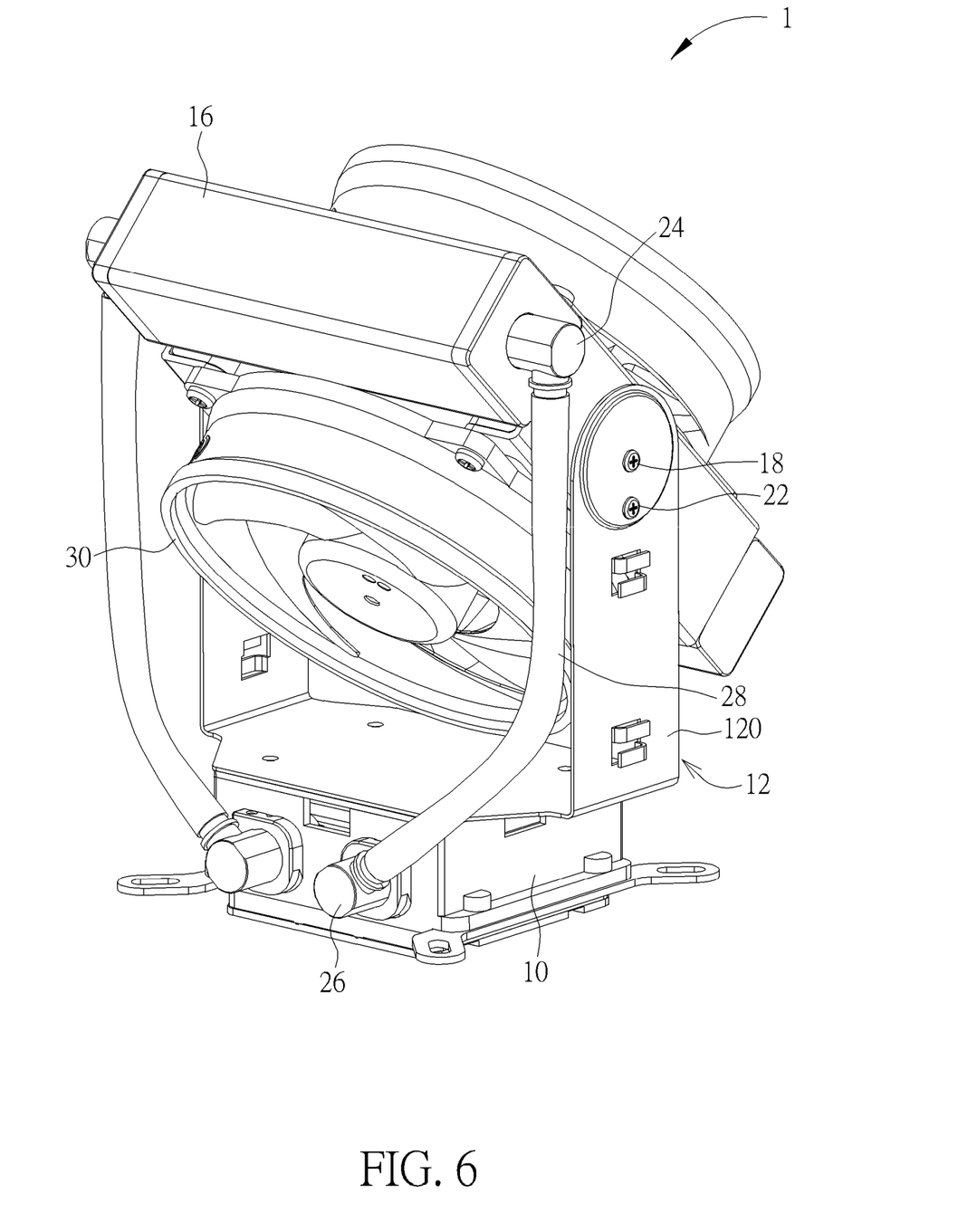
FIG. 6 is a schematic view illustrating the radiator shown in FIG. 1 after being rotated.
Figure 7:
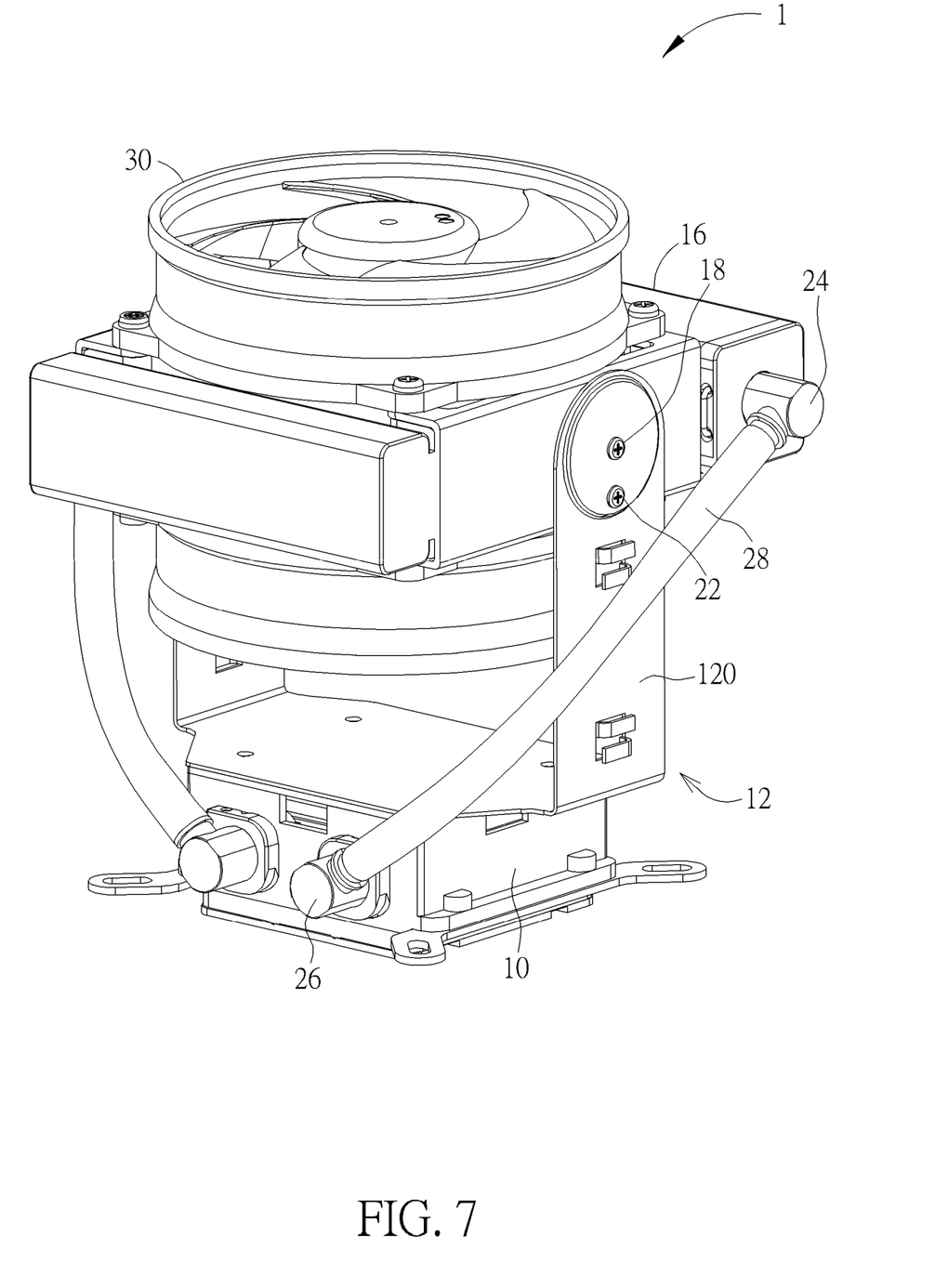
FIG. 7 is another schematic view illustrating the radiator shown in FIG. 1 after being rotated.

Referring to FIGS. 1 to 7, FIG. 1 is a schematic view illustrating a liquid cooling system 1 according to an embodiment of the invention, FIG. 2 is an exploded view illustrating the liquid cooling system 1 shown in FIG. 1, FIG. 3 is an exploded view illustrating the liquid cooling system 1 shown in FIG. 1 from another viewing angle, FIG. 4 is an exploded view illustrating the support frame 12 and the positioning member 14 shown in FIG. 2, FIG. 5 is a perspective view illustrating the support frame 12 shown in FIG. 1 after being removed, FIG. 6 is a schematic view illustrating the radiator 16 shown in FIG. 1 after being rotated, and FIG. 7 is another schematic view illustrating the radiator 16 shown in FIG. 1 after being rotated.

As shown in FIGS. 1 to 7, the liquid cooling system 1 comprises a liquid cooling head 10, a support frame 12, two positioning members 14, a radiator 16, two pivot shafts 18, two retaining rings 20, two fixing members 22, two first taps 24, two second taps 26, two tubes 28 and two fans 30. The support frame 12 is disposed on the liquid cooling head 10. In this embodiment, the support frame 12 has two side plates 120 opposite to each other. Each of the positioning members 14 is disposed on one of the two side plates 120 and each of the positioning members 14 has at least two positioning recesses 140. In this embodiment, each of the positioning members 14 has four positioning recesses 140. It should be noted that the number and position of the positioning recesses 140 are related to a rotation angle of the radiator 16, so the invention can adjust the number and position of the positioning recesses 140 according to practical applications. Accordingly, the invention is not limited to the embodiment shown in the figures. In this embodiment, each of the positioning members 14 has a fixing portion 142. The fixing member 22 passes through a hole 122 of the side plate 120 correspondingly and is fixed to the fixing portion 142 of the positioning member 14, such that the positioning member 14 is fixed on the side plate 120, as shown in FIGS. 2 to 4.

The radiator 16 is disposed between and pivotally connected to the two side plates 120 of the support frame 12. In this embodiment, opposite sides of the radiator 16 has a pivot protrusion 160 and the pivot protrusion 160 has a ring-shaped recess 162. In the invention, the positioning member 14 may be sleeved on the pivot protrusion 160 of the radiator 16 through a hole 144 and then the retaining ring 20 is engaged with the ring-shaped recess 162, such that the positioning member 14 is sandwiched in between the retaining ring 20 and the radiator 16, as shown in FIGS. 4 and 5. Then, the pivot shaft 18 passes through a hole 124 of the side plate 120 correspondingly and is pivotally connected to the pivot protrusion 160 of the radiator 16, such that the radiator 16 is pivotally connected to the side plate 120, as shown in FIGS. 1 to 4. Accordingly, the radiator 16 is capable of rotating with respect to the side plate 120 of the support frame 12, so as to rotate with respect to the liquid cooling head 10.

In this embodiment, opposite sides of the radiator 16 have a positioning protrusion 164. The positioning protrusion 164 is engaged with one of the at least two positioning recesses 140 of the positioning member 14, such that the radiator 16 is capable of rotating with respect to the liquid cooling head 10 between at least two different positions. For example, a user may rotate the radiator 16 with respect to the liquid cooling head 10 from a position shown in FIG. 1 to another position shown in FIG. 6 or 7. Accordingly, the user or a manufacturer can adjust the position of the radiator 16 with respect to the liquid cooling head 10 according to the arrangement of electronic components in an electronic device, so as to prevent the liquid cooling system 1 from interfering with the electronic components in the electronic device. Accordingly, the liquid cooling system 1 of the invention can be applied to various electronic devices.

The two first taps 24 are rotatably disposed at opposite sides of the radiator 16 and the two second taps 26 are rotatably disposed on the liquid cooling head 10. Furthermore, the two tubes 28 are used to connect the two first taps 24 and the two second taps 26, so as to form a circulation path for a liquid flowing therein. In this embodiment, the two first taps 24 may be rotatably disposed at opposite sides of the radiator 16 in a first axial direction A1, the two second taps 26 may be rotatably disposed on the liquid cooling head 10 in a second axial direction A2, and the two fans 30 may be disposed on the radiator 16 in the second axial direction A2, wherein the first axial direction A1 is different from the second axial direction A2, as shown in FIG. 1. In this embodiment, the first axial direction A1 is perpendicular to the second axial direction A2, but is not so limited. In this embodiment, the two fans 30 are disposed on opposite sides of the radiator 16. However, in another embodiment, the liquid cooling system 1 may comprise one single fan 30. In other words, the number of the fans 30 may be determined according to practical applications.

Since the first taps 24 and the fans 30 are disposed on the radiator 16 in different axial directions A1, A2 and the first taps 24 and the second taps 26 can rotate, the tubes 28 connecting the first taps 24 and the second taps 26 will not interfere with the fans 30 during the rotation of the radiator 16 with respect to the liquid cooling head 10. Accordingly, the radiator 16 can rotate with respect to the liquid cooling head 10 smoothly and the tubes 28 will not be pulled by the fans 30, so as to prevent the tubes 28 from coming off the first taps 24 and/or the second taps 26.

Figure 8:
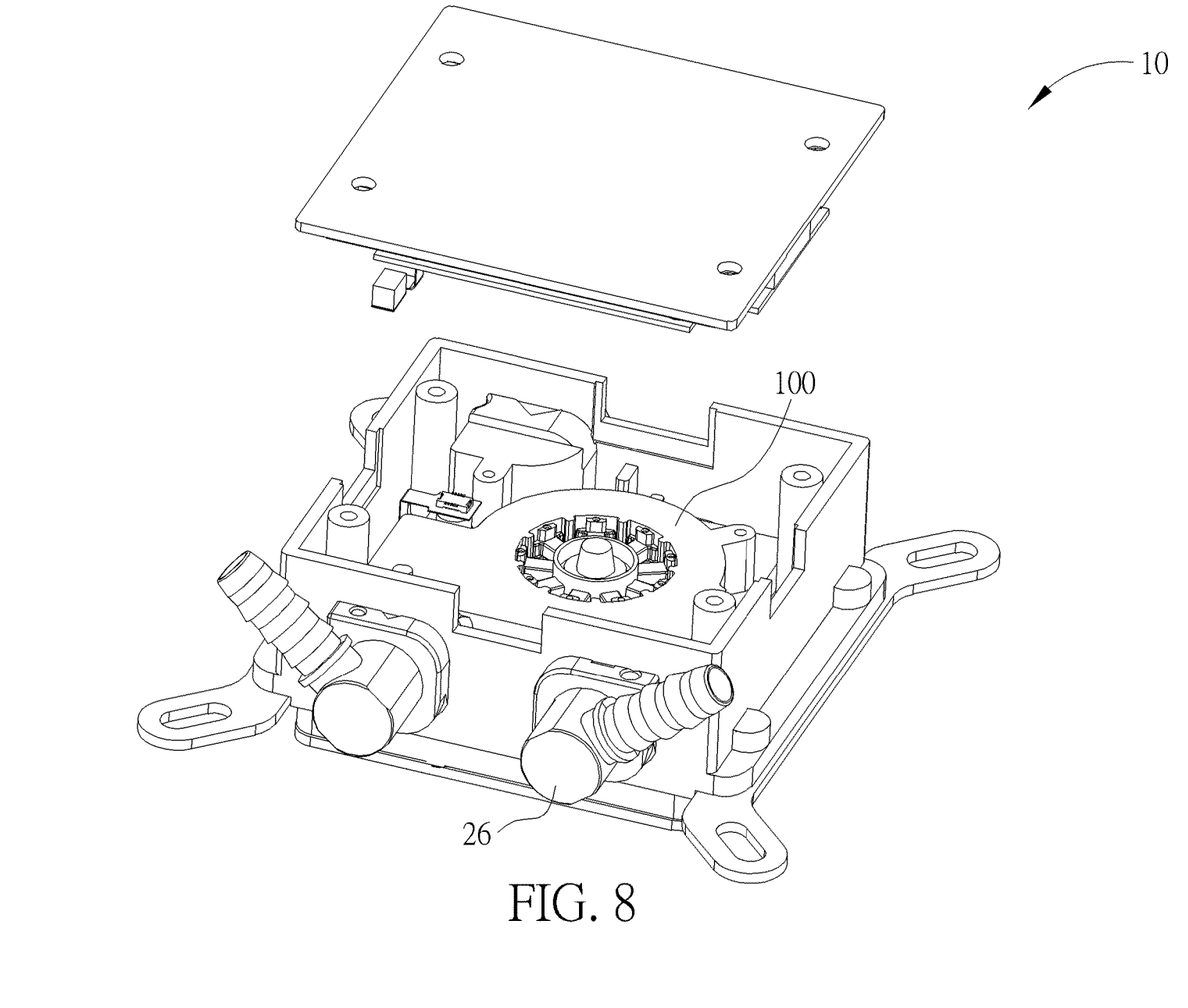
FIG. 8 is an exploded view illustrating the liquid cooling head shown in FIG. 1.

Referring to FIG. 8, FIG. 8 is an exploded view illustrating the liquid cooling head 10 shown in FIG. 1. In this embodiment, the liquid cooling head 10 may comprise a pump 100, as shown in FIG. 8. In practical applications, the liquid cooling system 1 may be disposed on a circuit board (not shown), such that the liquid cooling head 10 may be attached on an electronic component of the circuit board, e.g. a processor, a graphics card, other integrated circuit chips and so on. When the liquid cooling system 1 is dissipating heat from the electronic component, the liquid cooling head 10 absorbs the heat generated by the electronic component and then a cooling liquid (not shown) in the liquid cooling head 10 absorbs the heat. Then, the pump 100 transports the cooling liquid out of the liquid cooling head 10. When the cooling liquid flows through the radiator 16, the fan 30 can dissipate heat from the radiator 16, so as to cool the cooling liquid. It should be noted that the pump 100 may also be disposed outside the liquid cooling head 10, so the pump 100 is not limited to be disposed in the liquid cooling head 10.

Figure 9:
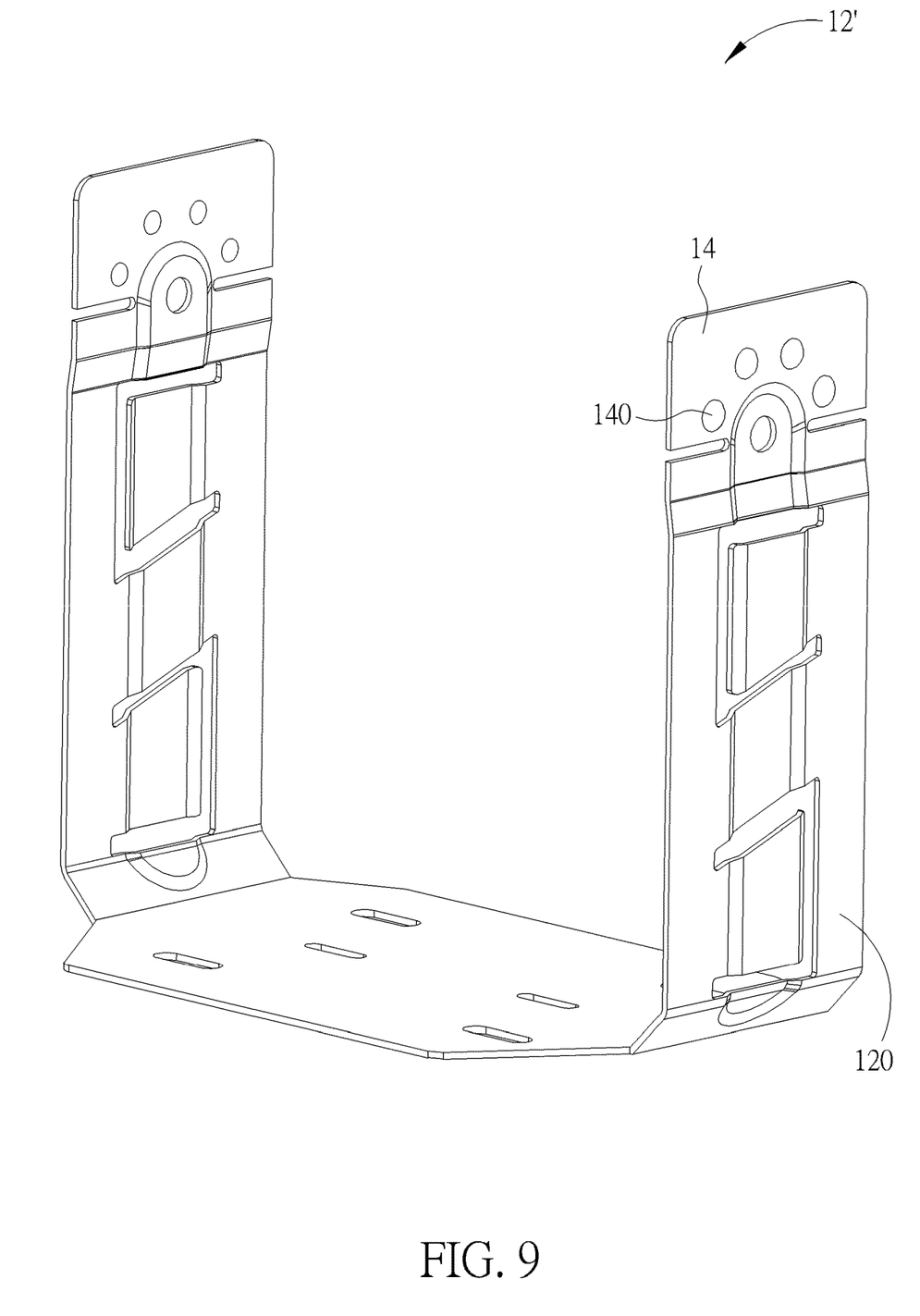
FIG. 9 is a perspective view illustrating a support frame according to another embodiment of the invention.

Referring to FIG. 9, FIG. 9 is a perspective view illustrating a support frame 12' according to another embodiment of the invention. The main difference between the support frame 12 and the aforesaid frame 12' is that the positioning member 14 and the side plate 120 of the support frame 12' are formed integrally, as shown in FIG. 9. Accordingly, the invention may replace the support frame 12 and the positioning member 14 of the aforesaid liquid cooling system 1 by the support frame 12' shown in FIG. 9.

Figure 10:
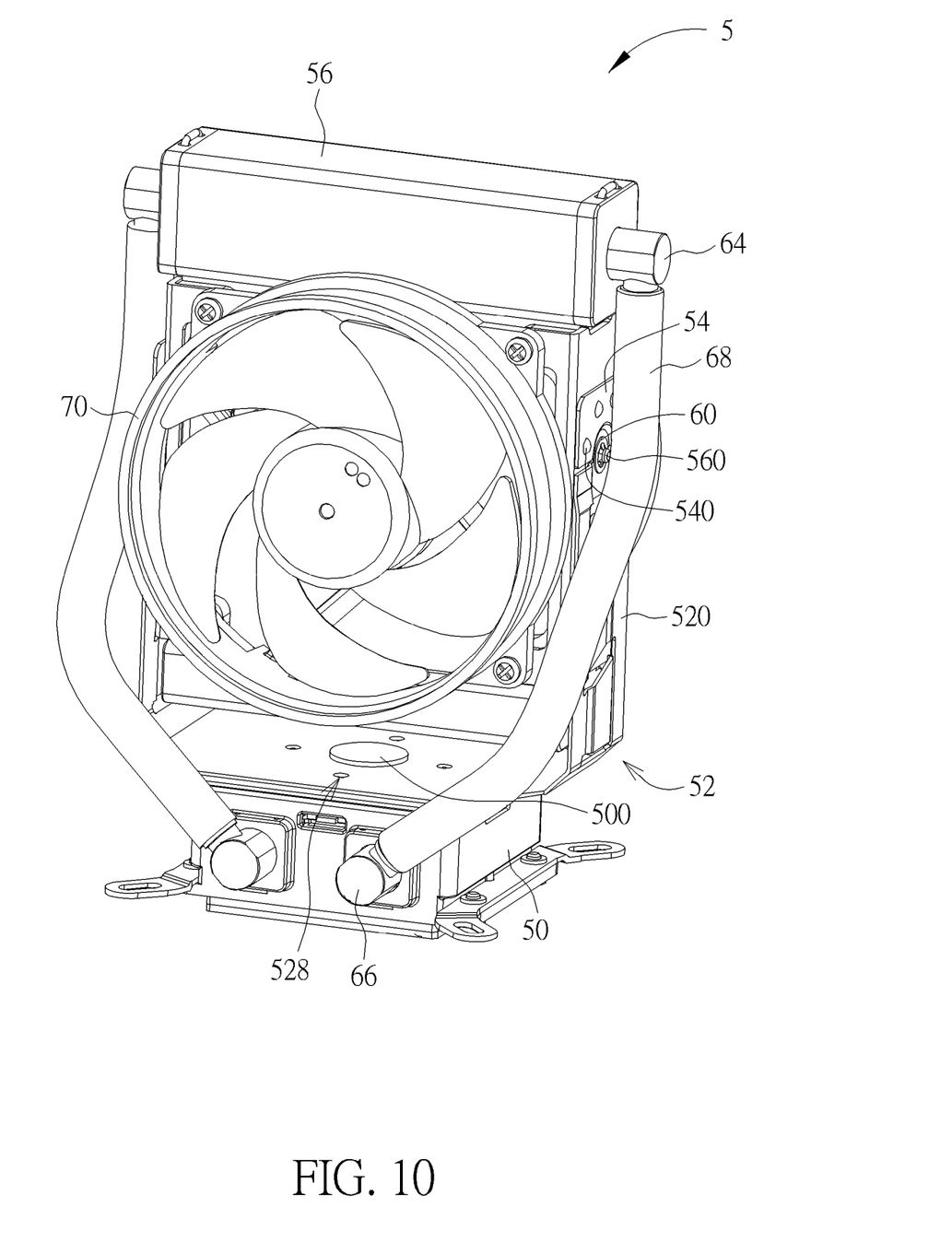
FIG. 10 is a schematic view illustrating a liquid cooling system according to another embodiment of the invention.
Figure 11:
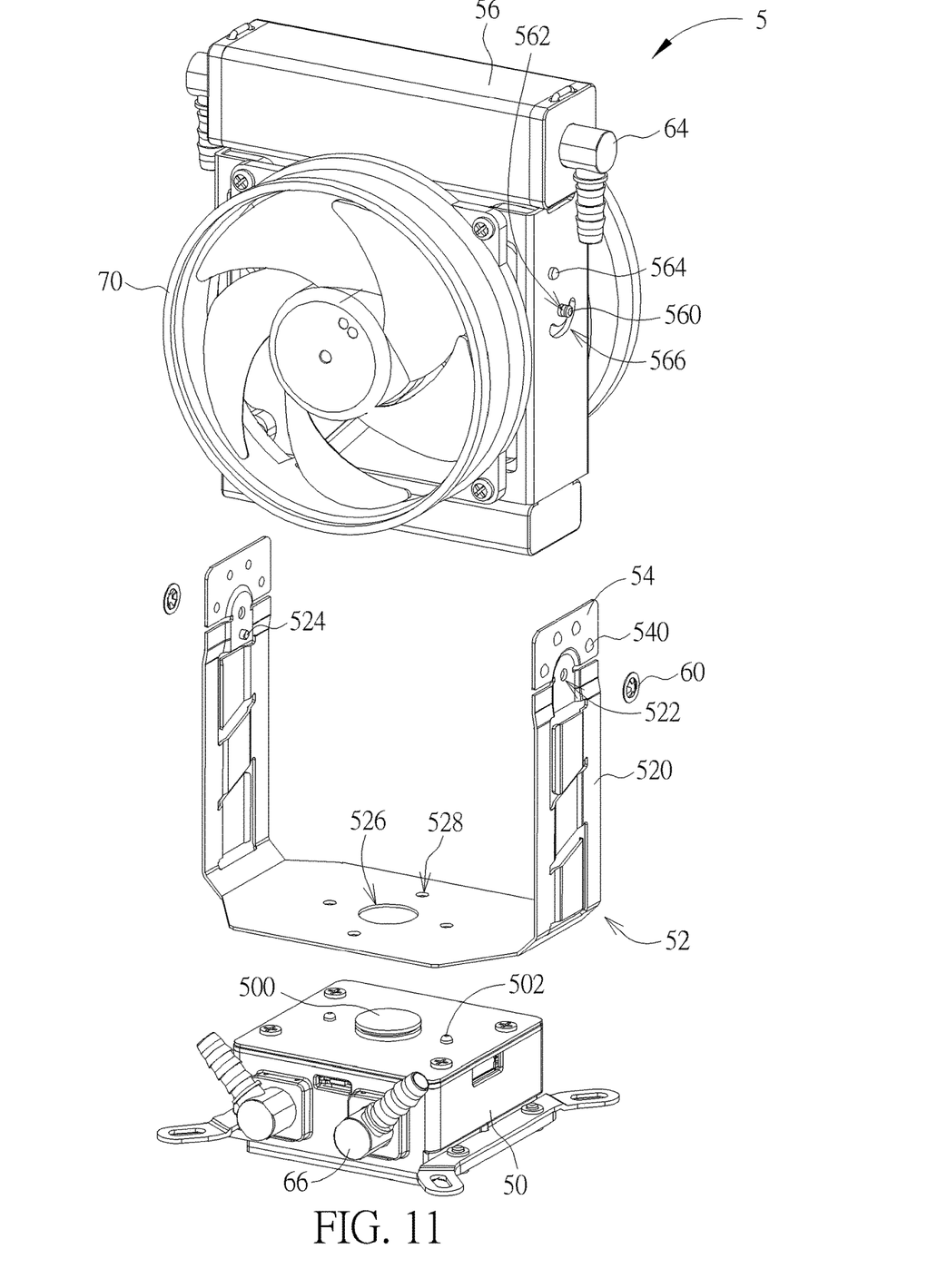
FIG. 11 is an exploded view illustrating the liquid cooling system shown in FIG. 10.
Figure 12:
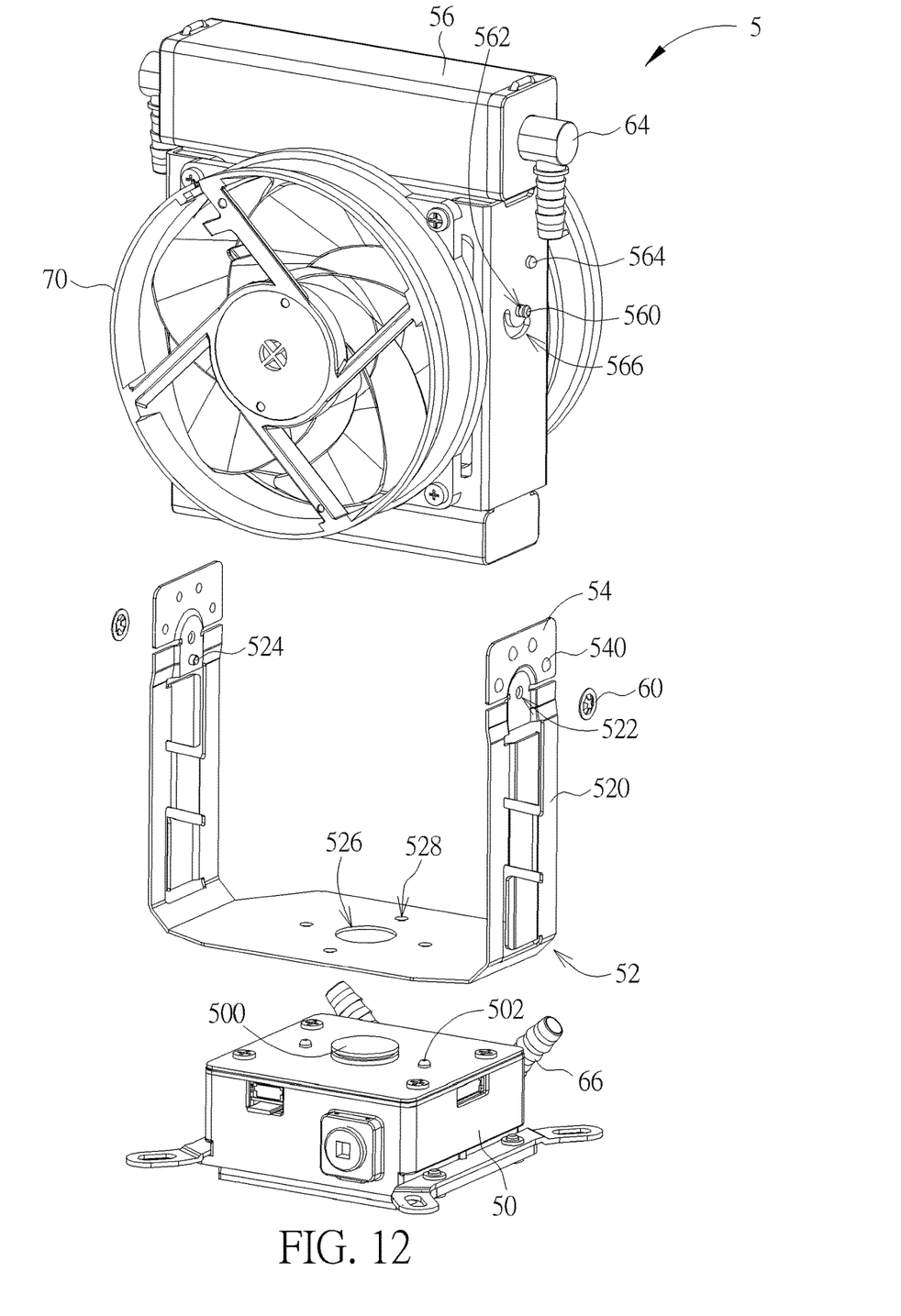
FIG. 12 is an exploded view illustrating the liquid cooling system shown in FIG. 10 from another viewing angle.
Figure 13:
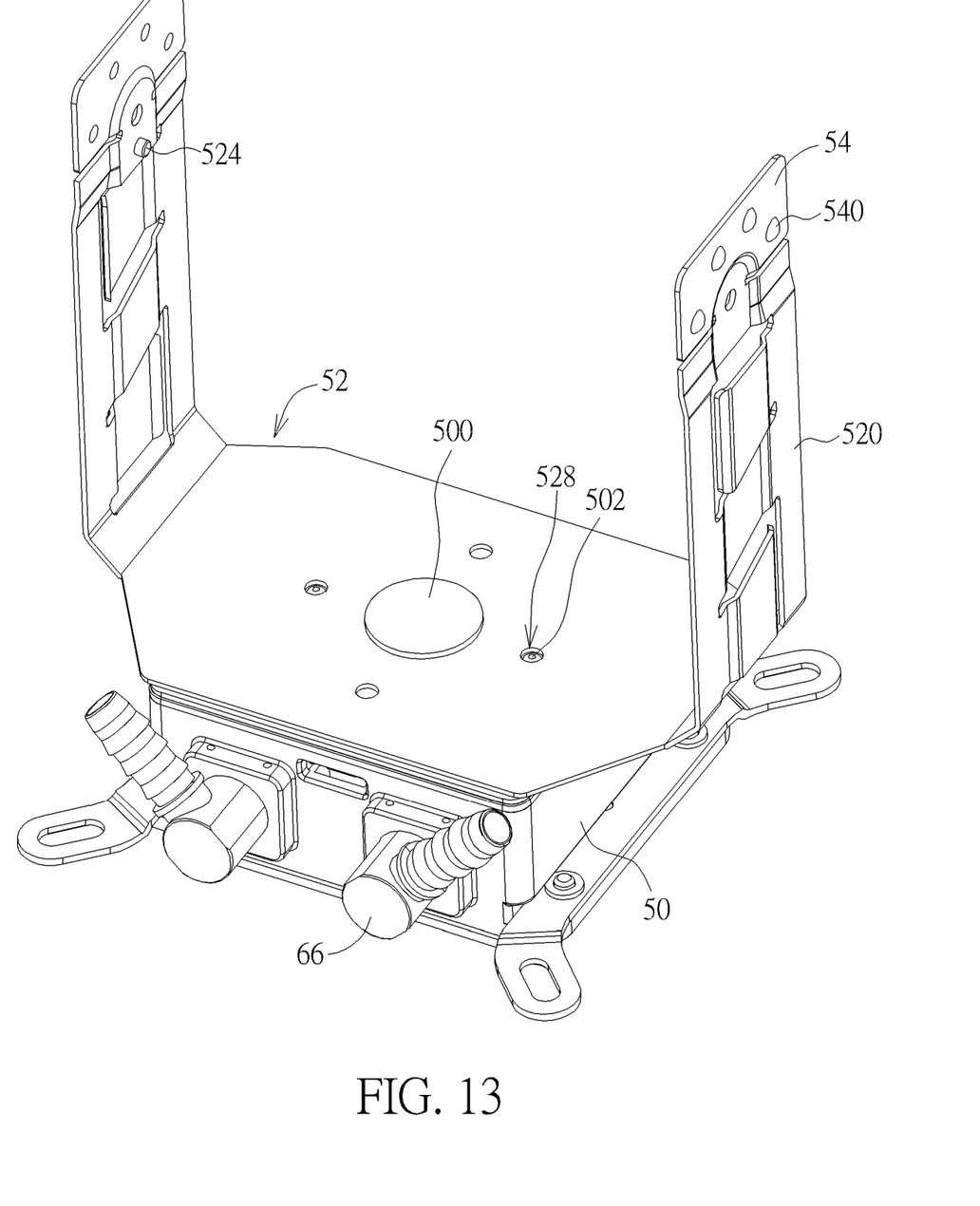
FIG. 13 is an assembly view illustrating the support frame and the liquid cooling head shown in FIG. 11.
Figure 14:
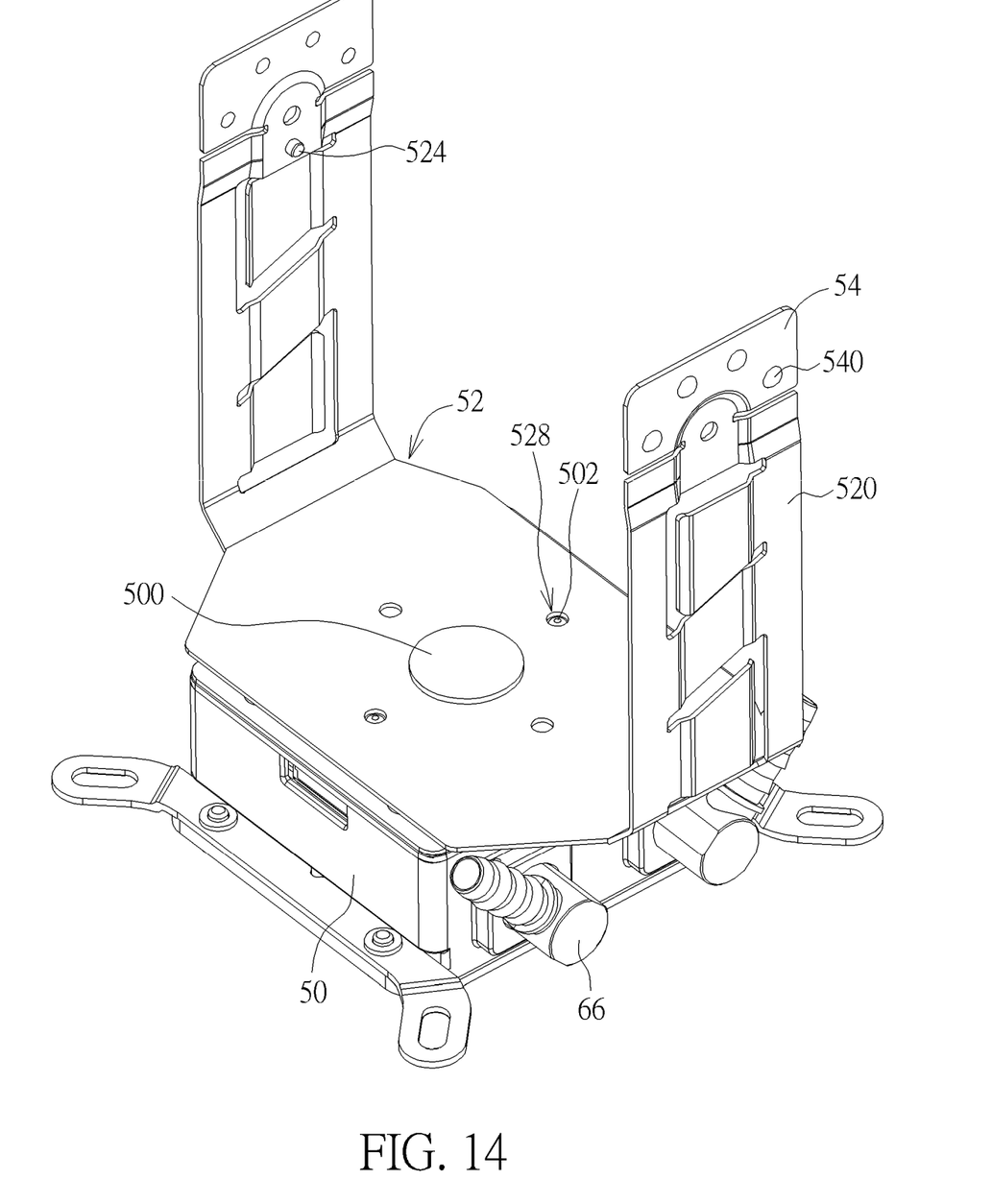
FIG. 14 is a perspective view illustrating the support frame shown in FIG. 13 after being rotated.

Referring to FIGS. 10 to 14, FIG. 10 is a schematic view illustrating a liquid cooling system 5 according to another embodiment of the invention, FIG. 11 is an exploded view illustrating the liquid cooling system 5 shown in FIG. 10, FIG. 12 is an exploded view illustrating the liquid cooling system 5 shown in FIG. 10 from another viewing angle, FIG. 13 is an assembly view illustrating the support frame 52 and the liquid cooling head 50 shown in FIG. 11, and FIG. 14 is a perspective view illustrating the support frame 12 shown in FIG. 13 after being rotated.

As shown in FIGS. 10 to 12, the liquid cooling system 5 comprises a liquid cooling head 50, a support frame 52, two positioning members 54, a radiator 56, two retaining rings 60, two first taps 64, two second taps 66, two tubes 68 and two fans 70. The support frame 52 is disposed on the liquid cooling head 50. In this embodiment, the support frame 52 has two side plates 520 opposite to each other. The positioning member 54 and the side plate 520 are formed integrally and each of the positioning members 54 has at least two positioning recesses 540. In this embodiment, each of the positioning members 54 has four positioning recesses 540. It should be noted that the number and position of the positioning recesses 540 are related to a rotation angle of the radiator 56, so the invention can adjust the number and position of the positioning recesses 540 according to practical applications. Accordingly, the invention is not limited to the embodiment shown in the figures.

The radiator 56 is disposed between and pivotally connected to the two side plates 520 of the support frame 52. In this embodiment, opposite sides of the radiator 56 has a pivot protrusion 560 and the pivot protrusion 560 has a ring-shaped recess 562. Furthermore, each of the side plate 520 has a hole 522 formed thereon. In the invention, the pivot protrusion 560 of the radiator 56 passes through the hole 522 of the side plate 520 and then the retaining ring 60 is engaged with the ring-shaped recess 562, such that the radiator 56 is pivotally connected to the side plate 520. Accordingly, the radiator 56 is capable of rotating with respect to the side plate 520 of the support frame 52, so as to rotate with respect to the liquid cooling head 50.

In this embodiment, opposite sides of the radiator 56 have a positioning protrusion 564. The positioning protrusion 564 is engaged with one of the at least two positioning recesses 540 of the positioning member 54, such that the radiator 56 is capable of rotating with respect to the liquid cooling head 50 between at least two different positions. Accordingly, a user or a manufacturer can adjust the position of the radiator 56 with respect to the liquid cooling head 50 according to the arrangement of electronic components in an electronic device, so as to find out the optimal direction for heat dissipation. Furthermore, the invention can be adapted to different space, so as to prevent the liquid cooling system 5 from interfering with the electronic components in the electronic device. Accordingly, the liquid cooling system 5 of the invention can be applied to various electronic devices.

In this embodiment, each of the side plate 520 further has a restraining portion 524 and opposite sides of the radiator 56 have a restraining groove 566, as shown in FIGS. 11 and 12. The restraining portion 524 is disposed in the restraining groove 566, such that the restraining portion 524 can cooperates with the restraining groove 566 to restrain a rotation angle of the radiator 56, so as to prevent the radiator 56 from over-rotating.

It should be noted that the arrangement and principle of the first taps 64, the second taps 66, the tubes 68 and the fans 70 are substantially the same as the arrangement and principle of the first taps 24, the second taps 26, the tubes 28 and the fans 30, so those will not be depicted herein again. Furthermore, the principle of the liquid cooling head 50 is also substantially the same as the principle of the liquid cooling head 10, so it will not be depicted herein again either.

In this embodiment, the liquid cooling head 50 may have a shaft 500 and the support frame 52 may have a shaft hole 526. The shaft 500 of the liquid cooling head 50 is pivotally connected to the shaft hole 526 of the support frame 52, such that the support member 52 is capable of rotating with respect to the liquid cooling head 50. Still further, the liquid cooling head 50 may have at least one positioning protrusion 502 and the support frame 52 may have a plurality of positioning holes 528 formed thereon. The positioning protrusion 502 is engaged with one of the positioning holes 528 when the support frame 52 rotates with respect to the liquid cooling head 50 with a predetermined angle (e.g. 90 degrees), so as to fix the support frame 52 with respect to the liquid cooling head 50, as shown in FIGS. 13 and 14. Accordingly, the user or the manufacturer can rotate the support frame 52 with respect to the liquid cooling head 50, so as to orient the radiator 56 disposed on the support frame 52 toward different directions. It should be noted that the number and position of the positioning holes 528 are related to a rotation angle of the support frame 52, so the invention can adjust the number and position of the positioning holes 528 according to practical applications. Accordingly, the invention is not limited to the embodiment shown in the figures. Moreover, the liquid cooling head 50 of this embodiment has two positioning protrusions 502. However, in another embodiment, the liquid cooling head 50 may has one single positioning protrusion 502.

As mentioned in the above, since the radiator can rotate with respect to the liquid cooling head between at least two different positions, a user or a manufacturer can adjust the position of the radiator with respect to the liquid cooling head according to the arrangement of electronic components in an electronic device, so as to prevent the liquid cooling system from interfering with the electronic components in the electronic device. Accordingly, the liquid cooling system of the invention can be applied to various electronic devices. Furthermore, since the taps and the fans are disposed on the radiator in different axial directions and the taps can rotate, the tubes connecting the taps will not interfere with the fans during the rotation of the radiator with respect to the liquid cooling head. Accordingly, the radiator can rotate with respect to the liquid cooling head smoothly and the tubes will not be pulled by the fans, so as to prevent the tubes from coming off the taps. Moreover, in an embodiment, the user or the manufacturer can rotate the support frame with respect to the liquid cooling head, so as to orient the radiator disposed on the support frame toward different directions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A liquid cooling system comprising:
a liquid cooling head;
a support frame disposed on the liquid cooling head, the support frame having two side plates opposite to each other;
two positioning members, each of the positioning members being disposed on one of the two side plates, each of the positioning members having at least two positioning recesses and a fixing portion;
a radiator disposed between and pivotally connected to the two side plates, opposite sides of the radiator having a pivot protrusion and a positioning protrusion, the positioning protrusion being engaged with one of the at least two positioning recesses, such that the radiator is capable of rotating with respect to the liquid cooling head between at least two different positions;
two pivot shafts, each of the two pivot shafts passing through one of the two side plates and being pivotally connected to the pivot protrusion of the radiator; and
two fixing members, each of the fixing members passing through one of the two side plates and being fixed to the fixing portion of the positioning member, such that each of the positioning members is fixed on a corresponding side plate.

2. The liquid cooling system of claim 1, further comprising two retaining rings, the pivot protrusion having a ring-shaped recess, the retaining ring being engaged with the ring-shaped recess, such that the positioning member is sandwiched in between the retaining ring and the radiator.

3. The liquid cooling system of claim 1, further comprising two first taps, two second taps and two tubes, the two first taps being rotatably disposed at opposite sides of the radiator, the two second taps being rotatably disposed on the liquid cooling head, the two tubes connecting the two first taps and the two second taps.

4. The liquid cooling system of claim 3, wherein the two first taps are rotatably disposed at opposite sides of the radiator in a first axial direction, the two second taps are rotatably disposed on the liquid cooling head in a second axial direction, and the first axial direction is different from the second axial direction.

5. The liquid cooling system of claim 4, further comprising at least one fan disposed on the radiator in the second axial direction.

6. The liquid cooling system of claim 4, wherein the first axial direction is perpendicular to the second axial direction.

7. The liquid cooling system of claim 1, wherein the liquid cooling head comprises a pump.

8. The liquid cooling system of claim 1, further comprising two retaining rings, the pivot protrusion having a ring-shaped recess, each of the two side plates having a hole formed thereon, each of the two pivot shafts passing through one of the two side plate holes, the two retaining rings being engaged with the corresponding ring-shaped recess.

9. The liquid cooling system of claim 1, wherein the liquid cooling head has a shaft, the support frame has a shaft hole, and the shaft is pivotally connected to the shaft hole, such that the support member is capable of rotating with respect to the liquid cooling head.

10. The liquid cooling system of claim 9, wherein the liquid cooling head has at least one positioning protrusion, the support frame has a plurality of positioning holes formed thereon, and the positioning protrusion is engaged with one of the positioning holes when the support frame rotates with respect to the liquid cooling head with a predetermined angle.

* * * * *